US009774323B2

(12) United States Patent
Ueta et al.

(10) Patent No.: US 9,774,323 B2
(45) Date of Patent: Sep. 26, 2017

(54) LOAD DRIVE CIRCUIT

(71) Applicant: Yazaki Corporation, Minato-ku, Tokyo (JP)

(72) Inventors: Keisuke Ueta, Susono (JP); Yoshihide Nakamura, Susono (JP); Yoshinori Ikuta, Susono (JP); Yasuyuki Shigezane, Susono (JP); Shuuji Satake, Susono (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 0 days.

(21) Appl. No.: 15/267,236

(22) Filed: Sep. 16, 2016

(65) Prior Publication Data

US 2017/0005653 A1 Jan. 5, 2017

Related U.S. Application Data

(63) Continuation of application No. PCT/JP2015/061914, filed on Apr. 17, 2015.

(30) Foreign Application Priority Data

Apr. 18, 2014 (JP) ................. 2014-086506

(51) Int. Cl.
- *H03K 3/00* (2006.01)
- *H03K 17/30* (2006.01)
- *H03K 17/22* (2006.01)
- *H02J 7/00* (2006.01)

(52) U.S. Cl.
CPC ............ *H03K 17/30* (2013.01); *H02J 7/0063* (2013.01); *H03K 17/22* (2013.01); *H02J 2007/004* (2013.01); *H02J 2007/0067* (2013.01)

(58) Field of Classification Search
None
See application file for complete search history.

(56) References Cited

U.S. PATENT DOCUMENTS

| 8,488,283 B2 | 7/2013 | Ando et al. |
| 9,270,111 B2 | 2/2016 | Ando et al. |
| 2011/0051296 A1 | 3/2011 | Ando et al. |

(Continued)

FOREIGN PATENT DOCUMENTS

| JP | 2000-197356 A | 7/2000 |
| JP | 2011-055333 A | 3/2011 |

OTHER PUBLICATIONS

Oct. 27, 2016—(WO) IPRP—App PCT/JP2015/061914.
May 26, 2015—International Search Report—Intl App PCT/JP2015/061914.

*Primary Examiner* — Long Nguyen
(74) *Attorney, Agent, or Firm* — Banner & Witcoff, Ltd.

(57) ABSTRACT

A load drive circuit shuts off power supply to a load when a semiconductor relay is off. The load drive circuit includes: the semiconductor relay which is turned off when a predetermined operation voltage cannot be secured; a low-voltage detection circuit which detects that the operation voltage is a predetermined value or less; a negative-voltage generation circuit which generates a negative voltage; and a switch unit which is turned on and connects between the negative-voltage generation circuit and a ground terminal of the semiconductor relay, in a case where the low-voltage detection circuit detects that the operation voltage is the predetermined value or less.

4 Claims, 5 Drawing Sheets

(56) References Cited

U.S. PATENT DOCUMENTS

2013/0015701 A1* 1/2013 Lee .................. H02J 7/1446
307/9.1
2013/0279047 A1 10/2013 Ando et al.
2016/0233856 A1* 8/2016 Wasekura .......... H03K 17/0828

* cited by examiner

LOAD DRIVE CIRCUIT

CROSS REFERENCE TO RELATED APPLICATIONS

This application is a continuation of PCT application No. PCT/JP15/061914, which was filed on Apr. 17, 2015 based on Japanese Patent Application (No. 2014-086506) filed on Apr. 18, 2014, the contents of which are incorporated herein by reference.

BACKGROUND OF THE INVENTION

1. Field of the Invention

The present invention relates to a load drive circuit.

2. Description of the Related Art

In a power supply box (hereinafter referred to as unit) for distributing electric power from a power supply in a vehicle, utilization of semiconductors is expanding so as to cope with requirement for weight reduction and power saving. Further in order to promote miniaturization, utilization of a configuration combining a conventional printer driver and an MOS-FET (or other device) is expanding, or utilization of an IPD (Intelligent Power Device) as a device integrating a driver and a control circuit having a protection function is expanding. An example of the IPD is disclosed in below-described Patent Document 1. These devices mostly contain a low-voltage shut-off function for preventing overheat caused by increase of an on-resistance upon voltage drop.

PRIOR ART DOCUMENT

Patent Document

Patent Document 1 is JP-A-2011-55333.

SUMMARY OF THE INVENTION

As a starter flows a large current, a terminal voltage of a battery drops due to an internal resistance of the battery. In this manner, the vehicle causes a phenomenon that the voltage drops temporarily upon starting an engine (in particular, during cranking). The vehicle contains loads required to be operated even during cranking at which the voltage drops temporarily. The low-voltage shut-off function is required to be avoided in order to operate these loads also during cranking. In order to avoid the low-voltage shut-off function, for example, it is considered to provide an auxiliary battery for assisting supply of power upon starting the engine or to provide a power system not relating to the engine start. However, in these cases, the power supply system is required to be changed entirely.

Further it is considered to mount a DC/DC converter for stabilizing the voltage but, in this case, large-sized components are required disadvantageously since a supply current is large.

Incidentally the temporal voltage drop also occurs during no idling, for example, as well as during the cranking. Thus the aforesaid problem commonly arises upon the voltage drop occurring at other timing as well as the voltage drop at the cranking.

The present invention aims to solve such the problems and an object of the present invention is to provide a load drive circuit which can drive a load by avoiding a low-voltage shut-off function during voltage drop, while suppressing the necessary number of large sized components without requiring entire change of a power supply system.

According to the present invention, there is provided a load drive circuit including a semiconductor relay which is turned off when a predetermined operation voltage cannot be secured, the load drive circuit shutting off power supply to a load when the semiconductor relay is off, the load drive circuit including: a low-voltage detection circuit which detects that the operation voltage is a predetermined value or less; a negative-voltage generation circuit which generates a negative voltage; and a switch unit which is turned on and connects between the negative-voltage generation circuit and a ground terminal of the semiconductor relay, in a case where the low-voltage detection circuit detects that the operation voltage is the predetermined value or less.

According to the load drive circuit of the present invention, when the operation voltage such as a voltage from a battery is detected to be the predetermined value or less, as the switch unit is turned on and connects between the negative-voltage generation circuit and the ground terminal of the semiconductor relay, a voltage of the ground terminal of semiconductor relay becomes the negative voltage generated from the negative-voltage generation circuit. Thus as the ground terminal is at the negative voltage even when the voltage from the battery drops, the operation voltage of the semiconductor relay can be secured and hence the low-voltage shut-off function can be avoided. Further as the low-voltage shut-off function can be avoided in the aforesaid manner, it is not necessary to provide an auxiliary battery or a power system not relating to the engine start, etc. or to mount a DC/DC converter. Consequently the load can be driven by avoiding the low-voltage shut-off function during the voltage drop, while suppressing the necessary number of large sized components without requiring entire change of a power supply system.

According to the load drive circuit of the present invention, preferably, the negative-voltage generation circuit generates the negative voltage in a case of receiving a signal representing necessity of driving a low-voltage drive load, and inhibits generation of the negative voltage in a case of not receiving the signal, the low-voltage drive load being a load which is determined in advance to be driven even in a case where the operation voltage drops and hence the predetermined operation voltage for the semiconductor relay cannot be secured.

According to the load drive circuit, the negative voltage is generated when the signal representing necessity of driving the low-voltage drive load is received, and the generation of the negative voltage is inhibited when this signal is not received. Thus when the low-voltage drive load is not required to be driven, as the negative voltage is not generated, power consumption can be suppressed.

According to the present invention, preferably, the load drive circuit further includes a control unit which outputs a ground switch ON signal in a time period where the operation voltage is expected to be the predetermined value or less, wherein the switch unit is turned on and connects between the negative-voltage generation circuit and the ground terminal of the semiconductor relay when the ground switch ON signal is outputted from the control unit.

According to the load drive circuit, in the time period where the operation voltage from the battery or the like is expected to drop, the ground switch ON signal is outputted, thereby causing the switch unit to connect between the negative-voltage generation circuit and the ground terminal of the semiconductor relay. Thus, for example, in a case where the voltage from the battery is the predetermined value or less, even if the switch unit is not turned on in response to the output from the low-voltage detection circuit due to a failure of the low-voltage detection circuit or the like, a voltage of the ground terminal becomes the negative voltage in the time period where the voltage from the battery is expected be the predetermined value or less. Consequently as the operation voltage of the semiconductor relay can be secured, the low-voltage shut-off function can be avoided.

According to the present invention, preferably, the load drive circuit further includes: a control unit which outputs an ON/OFF signal for the semiconductor relay; a connection line which connects an input terminal of the semiconductor relay to which a signal according to the ON/OFF signal is inputted and the ground terminal; and a voltage conversion circuit which prevents, in a case where the control unit outputs the OFF signal for the semiconductor relay, the semiconductor relay being turned on by the negative voltage applied to the ground terminal of the semiconductor relay from the negative-voltage generation circuit.

According to the load drive circuit, in order to prevent the semiconductor relay being turned on by the negative voltage applied to the ground terminal of the semiconductor relay in the case of outputting the OFF signal with respect to the semiconductor relay, the voltage conversion circuit is provided. Accordingly the semiconductor relay can be prevented being erroneously turned on due to a fact that, for example, the input terminal of the semiconductor relay is at 0V and the ground terminal is at the negative voltage.

According to the load drive circuit of the present invention, the load drive circuit can be provided which can drive a load by avoiding a low-voltage shut-off function during voltage drop, while suppressing the necessary number of large sized components without requiring entire change of a power supply system.

DETAILED DESCRIPTION OF THE EXEMPLARY EMBODIMENTS

Although explanation is made as to a preferred embodiment according to the present invention, the present invention is not limited to the embodiment explained below but may be changed suitably within a range not departing from the gist of the present invention.

Figure 1:
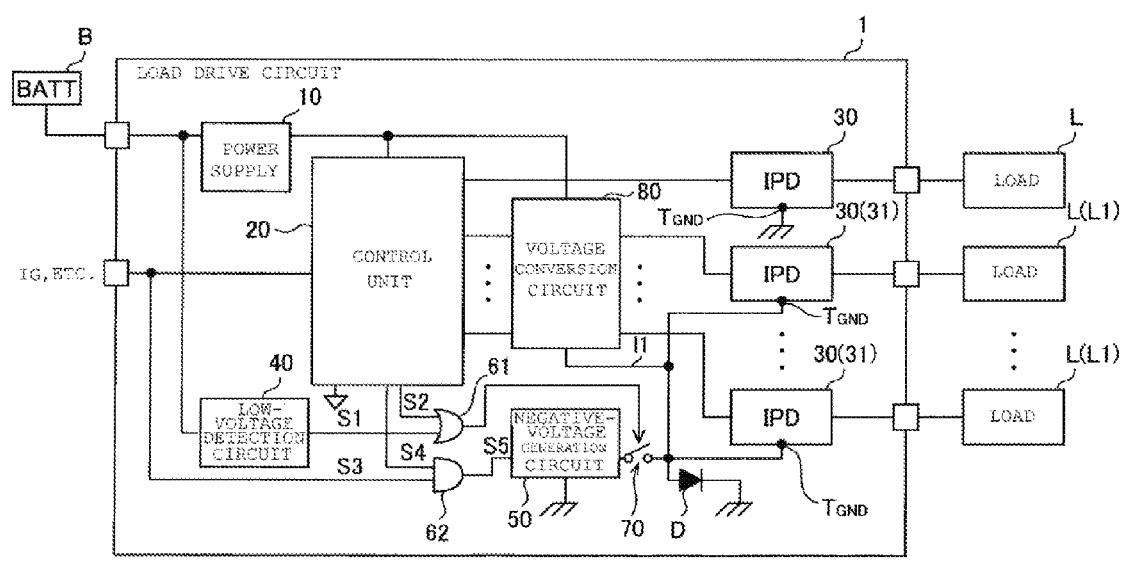
FIG. 1 is a circuit diagram schematically illustrating a load drive circuit according to an embodiment of the present invention.

FIG. 1 is a circuit diagram schematically illustrating a load drive circuit according to an embodiment of the present invention. A load drive circuit 1 shown in FIG. 1 is mounted in a vehicle and constituted as a unit provided between a battery B and loads L. This circuit includes a power supply 10, a control unit 20 and plural IPDs (semiconductor relays) 30.

The power supply 10 is applied with a voltage from the battery B and generates a prescribed voltage (for example, 5V). For example, a power supply IC is used as this power supply. The control unit 20 is constituted of a microcomputer, for example, and outputs an ON/OFF signal to each of the plural IPDs 30. The control unit 20 is applied with the voltage from the power supply 10 and receives, upon turning-on of an ignition switch (or a starter switch, a headlight switch), a signal representing this turning-on.

Each of the plural IPDs 30 is the semiconductor relay disposed between the battery B and corresponding one of the plural loads L, and shuts off power supply to the corresponding load upon turning-off of this IPD. In FIG. 1, illustration of connection lines from the battery B to the loads L is omitted.

Each of the plural IPDs 30 has a low-voltage shut-off function for turning itself off when the voltage from the battery B temporarily drops and cannot secure a predetermined operation voltage. This low-voltage shut-off function acts to prevent overheat caused by increase of an on-resistance upon the voltage drop. At least one IPD 31 of the plural IPDs 30 is connected to the load L1 (hereinafter referred to as low-voltage drive load L1) which is required to be driven when the voltage from the battery B drops.

Each of the plural IPDs 30 has a GND terminal (ground terminal) $T_{GND}$ being grounded. The IPD 31 connected to the low-voltage drive load L1 is grounded via a diode D.

In this configuration, for example, if the ignition switch is turned on, the control unit 20 receives the signal representing this turning-on and starts its operation. Then the control unit outputs ON signals to the IPDs 30 connected to the plural loads L to be driven, respectively. Consequently these plural loads L are supplied with power and driven.

However, during cranking or the like upon starting an engine in which the voltage from the battery B drops temporarily, the IPD 30 operates its low-voltage shut-off function and is placed in an off state. As a result, when the voltage from the battery B drops, the low-voltage drive load L1 required to be driven is not driven.

In view of this, the load drive circuit 1 according to the embodiment is provided with a low-voltage detection circuit 40, a negative-voltage generation circuit 50, an OR circuit 61, an AND circuit 62, a ground-line change-over switch (switch unit) 70, a voltage conversion circuit 80 and a connection line 11.

The low-voltage detection circuit 40 is a circuit for detecting that the voltage applied from the battery B is a low-voltage detection threshold value (predetermined value) or less, and outputs a low-voltage detection signal S1 when the applied voltage is the low-voltage detection threshold value or less. The low-voltage detection signal S1 is applied to the OR circuit 61.

The OR circuit 61 turns the ground-line change-over switch (hereinafter simply referred to as switch) 70 on when a GND switch ON signal (ground switch-on signal) S2 from the control unit 20 or the low-voltage detection signal S1 is inputted. The GND switch ON signal S2 is outputted in a time period such as the cranking time where the voltage from the battery B is expected in advance to be the low-voltage detection threshold value or less. The GND switch ON signal S2 is continuously outputted during this time period.

The AND circuit 62 outputs a negative-voltage generation signal S5 when both a signal S3 outputted upon turning-on of the ignition switch and a signal S4 from the control unit 20 are received. The signal S4 is outputted in an activation state of the control unit 20.

The negative-voltage generation circuit 50 generates a negative voltage (e.g., −2V) lower than a ground side voltage (i.e., 0V) of the IPD 30. An output of the negative-voltage generation circuit 50 is connected via the switch 70 to the GND terminal $T_{GND}$ of the IPD 31 which is connected to the low-voltage drive load L1.

Desirably none of the GND switch ON signal S2 and the signal S4 is outputted during a timing where the driving of the low-voltage drive load L1 is not necessary. This is because the low-voltage shut-off function is not required to be avoided during the timing where the low-voltage drive load L1 is not driven. The timing where the driving of the low-voltage drive load L1 is not necessary can be determined depending on whether or not a start request signal for the low-voltage drive load L1 outputted from, for example, a host device is inputted into the control unit 20. Thus the negative-voltage generation circuit 50 generates the negative voltage when the start request signal (signal representing necessity of driving) for the low-voltage drive load L1 is inputted, and inhibits the generation of the negative voltage when the start request signal is not inputted.

Figure 2:
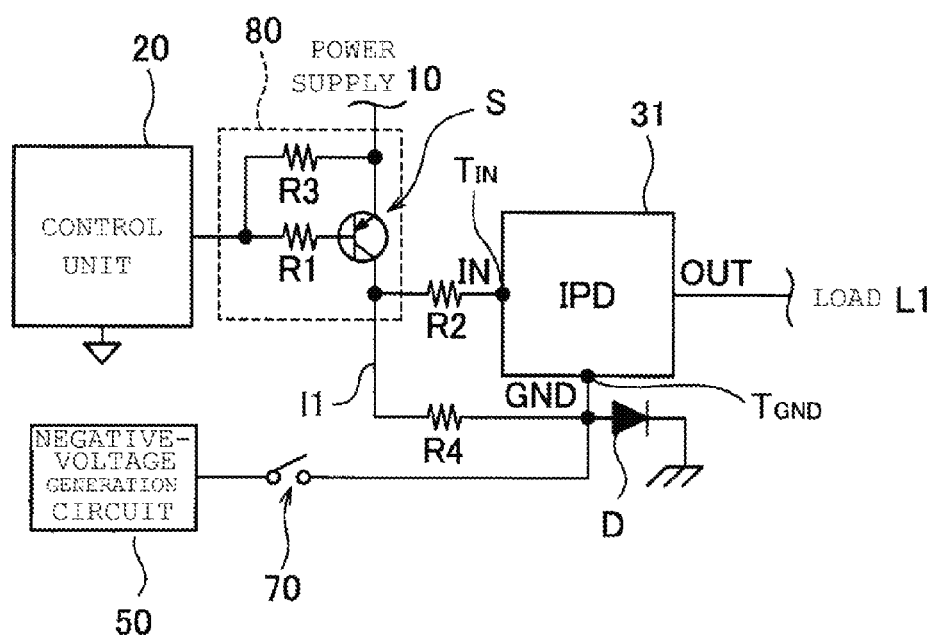
FIG. 2 is a circuit diagram illustrating details of a voltage conversion circuit of the load drive circuit according to the embodiment.

FIG. 2 is a circuit diagram illustrating details of the voltage conversion circuit 80 of the load drive circuit 1 according to the embodiment. For convenience of explanation, FIG. 2 also illustrates the control unit 20, the IPD 31, the negative-voltage generation circuit 50, the connection line 11, etc.

As shown in FIG. 2, the voltage conversion circuit 80 includes resistors R1, R3 and an N-type switching element S. The switching element S is, for example, a PNP transistor having a base connected to the control unit 20 via the resistor R1, an emitter connected to the power supply 10 and a collector connected to an IN terminal (input terminal) $T_{IN}$ of the IPD 31 via a resistor R2. The resistor R3 is connected between the collector and emitter of the PNP transistor as the switching element S.

The connection line 11 connects between the IN terminal $T_{IN}$ and the GND terminal $T_{GND}$ of the IPD 31. A resistor R4 is provided on the connection line 11.

Figure 3:
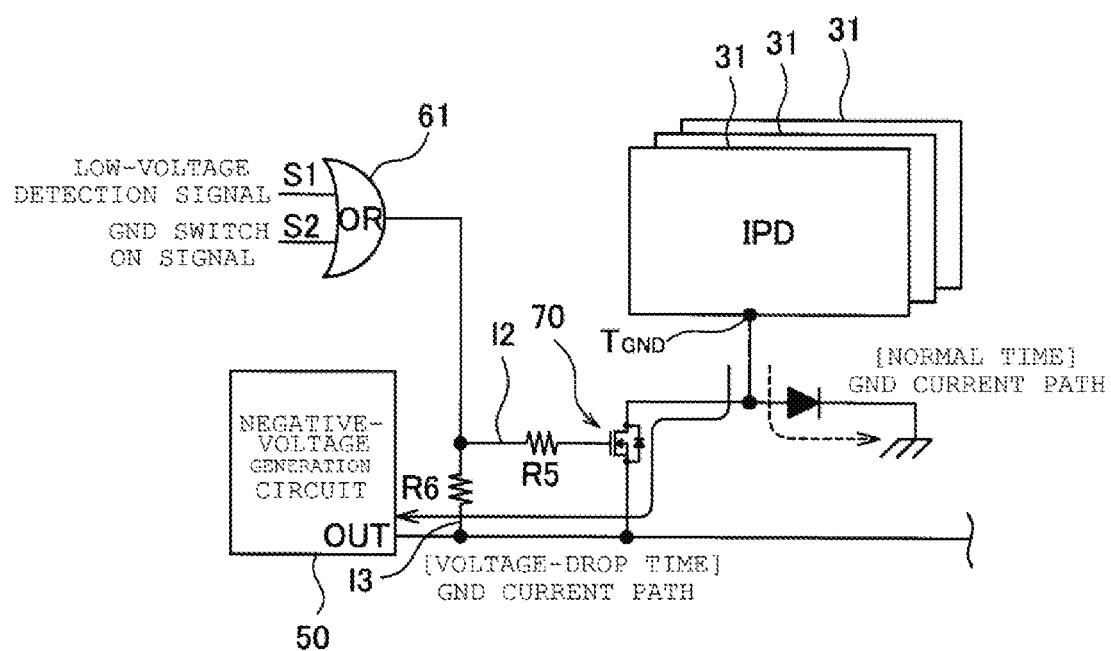
FIG. 3 is a detailed circuit diagram illustrating a main portion of the load drive circuit according to the embodiment.

Next an operation of the load drive circuit 1 according to the embodiment will be explained. FIG. 3 is a detailed circuit diagram illustrating a main portion of the load drive circuit 1 according to the embodiment. As shown in FIG. 3, a limit resistor R5 is provided on the way of a path from the OR circuit 61 to an N-channel FET as the switch 70. A path 13 is branched from a portion, between the OR circuit 61 and the limit resistor R5, on the way of a path 12 from the OR circuit 61 to the switch 70, and connected to the negative-voltage generation circuit 50. The N-channel FET has a source connected to the negative-voltage generation circuit 50 and a drain connected to the GND terminal $T_{GND}$.

In such the circuit configuration, the switch 70 is turned off when none of the low-voltage detection signal S1 and the GND switch ON signal S2 are inputted to the OR circuit 61. As a result, the GND terminal $T_{GND}$ of the IPD 31 is grounded via the diode D (see GND current path [normal time] shown by a broken arrow). In contrast, the switch 70 is turned on when the low-voltage detection signal S1 or the GND switch ON signal S2 is inputted to the OR circuit 61. As a result, the GND terminal $T_{GND}$ of the IPD 31 is connected to the negative-voltage generation circuit 50 and applied with the negative voltage (see GND current path [voltage-drop time] shown by a solid arrow).

Figure 4:
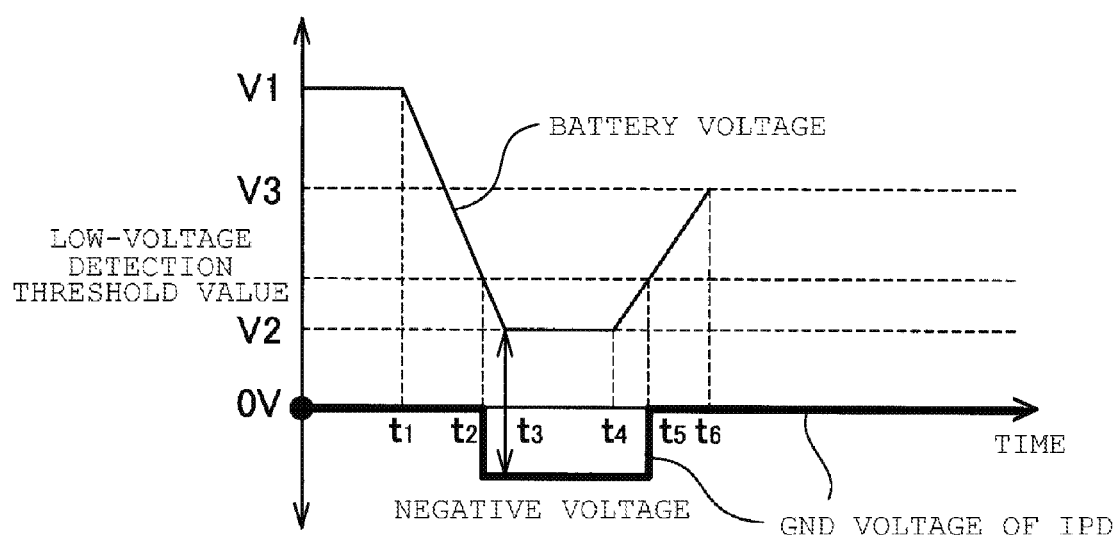
FIG. 4 is a timing chart illustrating an operation of the load drive circuit according to the embodiment.

FIG. 4 is a timing chart illustrating an operation of the load drive circuit 1 according to the embodiment. The timing chart illustrated in FIG. 4 represents an operation not taking the GND switch ON signal S2 into consideration.

As shown in FIG. 4, the voltage from the battery B is supposed to be V1 at a time 0. The voltage of the GND terminal $T_{GND}$ is 0V. Then the voltage from the battery B is supposed to start reducing from V1 at a time t1 and reach the low-voltage detection threshold value at a time t2. Thus the switch 70 is turned on and the voltage of the GND terminal $T_{GND}$ becomes the negative voltage generated by the negative-voltage generation circuit 50. Next the voltage from the battery B becomes V2 at a time t3.

A voltage value between the voltage V2 and the negative voltage (see a range shown by an arrow in FIG. 5) is the operation voltage or more of the IPD 31. Thus as the operation voltage of the IPD 31 is secured, the low-voltage shut-off function does not work.

Thereafter the voltage from the battery B keeps V2 and then starts increasing at a time t4. Then when the voltage exceeds the low-voltage detection threshold value at a time t5, the switch 70 is turned off and the voltage of the GND terminal $T_{GND}$ returns to 0V. Then the voltage from the battery B reaches V3 at a time t6 and thereafter maintains V3.

Next an operation of the voltage conversion circuit 80 will be explained with reference to FIG. 2. Firstly, in this embodiment, in a case of turning the IPD 31 on, the control unit 20 outputs an ON signal of an L level. Thus the switching element S is turned on and the voltage of the power supply 10 is applied to the IN terminal $T_{IN}$. Further as the GND terminal $T_{GND}$ is grounded and applied with 0V, the IPD 31 is turned on.

In contrast, in a case of turning the IPD 31 off, the control unit 20 outputs an OFF signal of an H level. Thus the switching element S is turned off. In this case, if the switch 70 is off, the IN terminal $T_{IN}$ is grounded via the connection line 11 as well as the GND terminal $T_{GND}$, whereby the IPD 31 is turned off. Even if the switch 70 is on, the negative voltage from the negative-voltage generation circuit 50 is applied not only to the GND terminal $T_{GND}$ but also to the IN terminal $T_{IN}$ via the connection line 11. Thus the IPD 31 is turned off.

Figure 5:
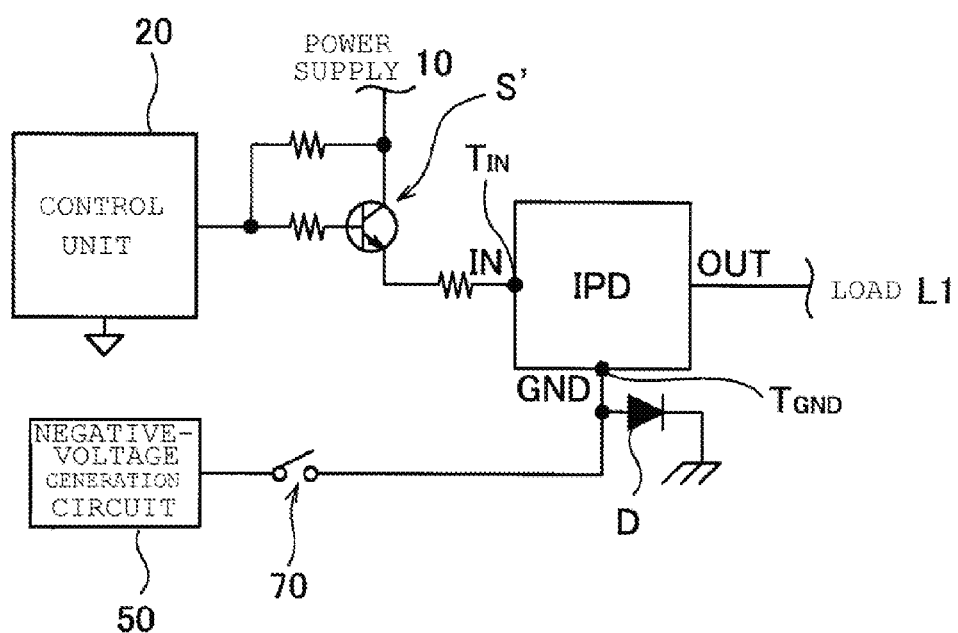
FIG. 5 is a circuit diagram illustrating a modified example of the load drive circuit according to the embodiment.

FIG. 5 is a circuit diagram illustrating a modified example of the load drive circuit 1 according to the embodiment. In this example, for example, the connection line 11 is removed from the load drive circuit 1 shown in FIG. 2, and the control unit 20 outputs an ON signal of an H level in a case of turning the IPD 31 on and outputs an OFF signal of an L level in a case of turning the IPD 31 off.

In this arrangement, in a case of turning the IPD 31 on, a switching element S' as an NPN transistor is turned on in response to the ON signal of the H level, the voltage from the power supply 10 is applied to the IN terminal $T_{IN}$. Further as the GND terminal $T_{GND}$ is grounded and applied with 0V, the IPD 31 is turned on.

In contrast, in a case of turning the IPD 31 off, the switching element S' is turned off in response to the OFF signal of the L level. Thus the IN terminal $T_{IN}$ becomes at 0V. If the switch 70 is off, as the GND terminal $T_{GND}$ is grounded and applied with 0V, the IPD 31 is turned off. In contrast, if the switch 70 is on, as the IN terminal $T_{IN}$ is at 0V and the GND terminal $T_{GND}$ is at the negative voltage, the IPD 31 is occasionally turned on. That is, the IPD 31 may be turned on unintentionally.

In this respect, the voltage conversion circuit 80 shown in FIG. 2 has a function of, in cooperation with the connection line 11, preventing the IPD 31 being turned on by the application of the negative voltage to the GND terminal $T_{GND}$ from the negative-voltage generation circuit 50 when the control unit 20 outputs the OFF signal with respect to the IPD 31.

The case where the IPD 31 is turned off corresponds to a timing during which the driving of the low-voltage drive load L1 connected to the IPD 31 is not necessary. Thus, in this case, the negative-voltage generation circuit 50 does not seem to generate the negative voltage. However, supposing that the load drive circuit 1 according to the embodiment performs a driving control with respect to a plurality of the low-voltage drive loads L1, the negative-voltage generation circuit 50 generates the negative voltage when at least one of the plural low-voltage drive loads L1 is required to be driven. In other words, there is a case that the IPD 31 corresponding to at least one of the plural low-voltage drive loads L1 is turned on and the IPDs corresponding to the remaining low-voltage drive loads L1 are turned off. In this case, as the problem explained with reference to FIG. 5 may occur, the circuit configuration shown in FIG. 2 is useful.

As described above, according to the load drive circuit 1 of the embodiment, when the voltage from the battery B is detected to be the low-voltage detection threshold value or less, as the switch 70 is turned on and connects between the negative-voltage generation circuit 50 and the GND terminal $T_{GND}$ of the IPD 31, a voltage of the GND terminal $T_{GND}$ of the IPD 31 becomes the negative voltage generated from the negative-voltage generation circuit 50. Thus as the GND terminal $T_{GND}$ is at the negative voltage even when the voltage from the battery B drops, the operation voltage of the IPD 31 can be secured and hence the low-voltage shut-off function can be avoided. Further as the low-voltage shut-off function can be avoided in the aforesaid manner, it is not necessary to provide an auxiliary battery or a power system not relating to the engine start, etc. or to mount a DC/DC converter. Accordingly the load can be driven by avoiding the low-voltage shut-off function during the voltage drop, while suppressing the necessary number of large sized components without requiring entire change of the power supply system.

Further the negative voltage is generated when the start request signal for the low-voltage drive load L1 is inputted, and the generation of the negative voltage is inhibited when this signal is not inputted. Thus in a case where none of the low-voltage drive loads L1 are required to be driven, as the negative voltage is not generated, power consumption can be suppressed.

Further, in the time period where the voltage from the battery B is expected to drop, the GND switch ON signal S2 is outputted, thereby causing the switch 70 to connect between the negative-voltage generation circuit 50 and the GND terminal $T_{GND}$ of the IPD 31. Thus, for example, in a case where the voltage from the battery B is the low-voltage detection threshold value or less, even if the switch 70 is not turned on in response to the output from the low-voltage detection circuit 40 due to a failure of the low-voltage detection circuit 40 or the like, the ground side voltage becomes the negative voltage in the time period where the voltage from the battery B is expected to be the low-voltage detection threshold value or less. Consequently as the operation voltage of the IPD 31 can be secured, the low-voltage shut-off function can be avoided.

Furthermore, in order to prevent the IPD 31 being turned on by the negative voltage applied to the GND terminal $T_{GND}$ of the IPD 31 in the case of outputting the OFF signal with respect to the IPD 31, the voltage conversion circuit 80 is provided. Accordingly the IPD 31 can be prevented being erroneously turned on due to a fact that, for example, the IN terminal $T_{IN}$ of the IPD 31 is at 0V and the GND terminal $T_{GND}$ is at the negative voltage.

As described above, although the present invention is explained based on the embodiment, the present invention is not limited to the embodiment but may be changed within a range not departing from the gist of the present invention. For example, the various kinds of resistors and the switching element S, etc. can be suitably changed within the range not departing from the gist of the present invention.

Further, although the IPD 30 is explained as an example of the semiconductor relay, the semiconductor relay may be a device formed by combining a predriver (having the low-voltage shut-off function) and an MOSFET, for example, or another device.

Further, when a failure of the low-voltage detection circuit 40 or disconnection or the like of a path from the battery B to the low-voltage detection circuit 40 occurs, the signal S4 may be outputted just before or simultaneously with the GND switch ON signal S2. When the failure of low-voltage detection circuit 40 or the disconnection or the like of the path from the battery B to the low-voltage detection circuit 40 occurs, the output of the OR circuit 61 is substantially controlled only by the GND switch ON signal S2 from the control unit 20. Thus, in correspondence to the GND switch ON signal S2, the signal S4 may be outputted just before or simultaneously with the GND switch ON signal S2. Of course, with respect to such the failure or the disconnection, a circuit for diagnosing the failure of low-voltage detection circuit 40 or a circuit for detecting the disconnection of the path from the battery B to the low-voltage detection circuit 40 is required.

Features of the load drive circuit according to the embodiment of the present invention will be briefly summarized and listed below in [1] to [4].

[1] A load drive circuit including a semiconductor relay which is turned off when a predetermined operation voltage cannot be secured, and which shuts off power supply to a load when the semiconductor relay is off, the load drive circuit including:

a low-voltage detection circuit which detects that the operation voltage is a predetermined value or less;

a negative-voltage generation circuit which generates a negative voltage; and a switch unit which is turned on and connects between the negative-voltage generation circuit and a ground terminal of the semiconductor relay, in a case where the low-voltage detection circuit detects that the operation voltage is the predetermined value or less.

[2] The load drive circuit described in [1], wherein the negative-voltage generation circuit generates the negative voltage in a case of receiving a signal representing necessity of driving a low-voltage drive load, and inhibits generation of the negative voltage in a case of not receiving the signal, the low-voltage drive load being a load which is determined in advance to be driven even in a case where the operation voltage drops and hence the predetermined operation voltage for the semiconductor relay cannot be secured.

[3] The load drive circuit described in [1] or [2], further including a control unit which outputs a ground switch ON signal in a time period where the operation voltage is expected to be the predetermined value or less, wherein the switch unit is turned on and connects between the negative-voltage generation circuit and the ground terminal of the semiconductor relay when the ground switch ON signal is outputted from the control unit.

[4] The load drive circuit described in [1] or [2], further including:

a control unit which outputs an ON/OFF signal for the semiconductor relay;

an input terminal of the semiconductor relay to which a signal according to the ON/OFF signal is inputted, and a connection line which connects the ground terminal; and a voltage conversion circuit which prevents, in a case where the control unit outputs the OFF signal for the semiconductor relay, the semiconductor relay being turned on by the negative voltage applied to the ground terminal of the semiconductor relay from the negative-voltage generation circuit.

A detailed description has been given of the present invention referring to the specific embodiment, but it will be clear by those skilled in the art that various changes and modifications can be made without departing from the spirit and scope of the present invention.

What is claimed is:

1. A load drive circuit that shuts off power supply to a load when a semiconductor relay is off, the load drive circuit comprising:
   the semiconductor relay which is turned off when a predetermined operation voltage cannot be secured;
   a low-voltage detection circuit which detects that the operation voltage is a predetermined value or less;
   a negative-voltage generation circuit which generates a negative voltage; and
   a switch unit which is turned on and connects between the negative-voltage generation circuit and a ground terminal of the semiconductor relay, in a case where the low-voltage detection circuit detects that the operation voltage is the predetermined value or less.

2. The load drive circuit according to claim 1, wherein the negative-voltage generation circuit generates the negative voltage in a case of receiving a signal representing necessity of driving a low-voltage drive load, and inhibits generation of the negative voltage in a case of not receiving the signal, the low-voltage drive load being a load which is determined in advance to be driven even in a case where the operation voltage drops and hence the predetermined operation voltage for the semiconductor relay cannot be secured.

3. The load drive circuit according to claim 1, further comprising:
   a control unit which outputs a ground switch ON signal in a time period where the operation voltage is expected to be the predetermined value or less, wherein
   the switch unit is turned on and connects between the negative-voltage generation circuit and the ground terminal of the semiconductor relay when the ground switch ON signal is outputted from the control unit.

4. The load drive circuit according to claim 1, further comprising:
   a control unit which outputs an ON/OFF signal for the semiconductor relay;
   a connection line which connects an input terminal of the semiconductor relay to which a signal according to the ON/OFF signal is inputted and the ground terminal; and
   a voltage conversion circuit which prevents, in a case where the control unit outputs the OFF signal for the semiconductor relay, the semiconductor relay being turned on by the negative voltage applied to the ground terminal of the semiconductor relay from the negative-voltage generation circuit.

* * * * *